US010504910B2

(12) United States Patent
Villavelez et al.

(10) Patent No.: US 10,504,910 B2
(45) Date of Patent: Dec. 10, 2019

(54) MEMORY CELL HAVING CLOSED CURVE STRUCTURE (71) Applicant: Hewlett-Packard Development Company, L.P., Houston, TX (US)

(72) Inventors: Reynaldo V. Villavelez, Corvallis, OR (US); Paul I. Mikulan, Carrollton, TX (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 15/352,449

(22) Filed: Nov. 15, 2016

(65) Prior Publication Data

US 2017/0062449 A1 Mar. 2, 2017

Related U.S. Application Data (63) Continuation of application No. 14/000,620, filed as application No. PCT/US2011/028537 on Mar. 15, 2011, now Pat. No. 9,524,780.

(51) Int. Cl.
*H01L 27/11524* (2017.01)
*H01L 21/28* (2006.01)
(Continued)

(52) U.S. Cl.
CPC ..... *H01L 27/11524* (2013.01); *B41J 2/04541* (2013.01); *B41J 2/04586* (2013.01); *G11C 16/10* (2013.01); *H01L 21/28273* (2013.01); *H01L 27/11519* (2013.01); *H01L 27/11521* (2013.01); *H01L 29/0692* (2013.01); *H01L 29/0696* (2013.01); *H01L 29/0847* (2013.01);
(Continued)

(58) Field of Classification Search
CPC .......... H01L 27/11524; H01L 21/28273; H41J 2/04541; G11C 16/10
USPC ..................................................... 365/185.15
See application file for complete search history.

(56) References Cited

U.S. PATENT DOCUMENTS 5,965,925 A 10/1999 Kornachuk et al.
5,973,354 A * 10/1999 Chang ............... H01L 27/11521
257/315
(Continued)

FOREIGN PATENT DOCUMENTS

CN 1230787 A 10/1999
JP 2000200884 A 7/2000

OTHER PUBLICATIONS

International Searching Authority, International Search Report and Written Opinion, PCT Application No. PCT/US2011/028537, dated Dec. 7, 2011, 9 pages.

(Continued)

*Primary Examiner* — Anthan Tran
(74) *Attorney, Agent, or Firm* — HP Inc. Patent Department (57) ABSTRACT A memory cell for a printhead includes a substrate with a source and a drain. The substrate further includes a channel located between the source and the drain and surrounding the drain. The drain can include a first rounded closed curved structure. The memory cell can include a floating gate and a control gate. The floating gate can include a second rounded closed curve structure located above the channel and below the control gate. The control gate is capacitively coupled to the floating gate.

18 Claims, 9 Drawing Sheets

(51) Int. Cl.
*G11C 16/10* (2006.01)
*H01L 27/11519* (2017.01)
*H01L 27/11521* (2017.01)
*H01L 29/788* (2006.01)
*H01L 29/423* (2006.01)
*H01L 29/66* (2006.01)
*H01L 29/06* (2006.01)
*B41J 2/045* (2006.01)
*H01L 29/08* (2006.01)
*H01L 29/10* (2006.01)

(52) U.S. Cl.
CPC .... *H01L 29/1033* (2013.01); *H01L 29/40114* (2019.08); *H01L 29/42324* (2013.01); *H01L 29/66825* (2013.01); *H01L 29/788* (2013.01); *H01L 29/7884* (2013.01)

(56) References Cited

U.S. PATENT DOCUMENTS

| | | | |
|---|---|---|---|
| 6,525,383 B1 * | 2/2003 | Stecher | H01L 29/0692 257/341 |
| 8,542,514 B1 * | 9/2013 | Lakshminarayanan | G11C 14/0054 257/324 |
| 2002/0050610 A1 | 5/2002 | Dray | |
| 2002/0054225 A1 * | 5/2002 | Hynecek | H01L 27/14609 348/294 |
| 2003/0230774 A1 | 12/2003 | Roijen | |
| 2004/0065917 A1 * | 4/2004 | Fan | H01L 27/11521 257/315 |
| 2004/0119113 A1 * | 6/2004 | Simacek | H01L 27/115 257/318 |
| 2004/0130947 A1 * | 7/2004 | Fan | G11C 16/0433 365/185.05 |
| 2006/0244036 A1 | 11/2006 | Wu | |
| 2007/0034922 A1 | 2/2007 | Bhattacharyya | |
| 2007/0170490 A1 * | 7/2007 | Moon | H01L 27/115 257/315 |
| 2008/0042221 A1 | 2/2008 | Tsau | |
| 2009/0039407 A1 | 2/2009 | Vora | |

OTHER PUBLICATIONS

European Patent Office, Extended European Search Report, dated Oct. 14, 2014, 6 pages.

* cited by examiner

MEMORY CELL HAVING CLOSED CURVE STRUCTURE

CROSS REFERENCE TO RELATED APPLICATIONS

This application is a Continuation of U.S. patent application Ser. No. 14/000,620, filed Aug. 21, 2013, entitled "MEMORY CELL HAVING CLOSED CURVE STRUCTURE," which is hereby incorporated by reference in its entirety.

BACKGROUND

Programmable read-only memory (PROM) chips are well known and widely used in a variety of computer devices. Typically, a PROM chip includes a grid of metal conductors forming rows and columns. Each row/column intersection includes a conductive fuse that provides one bit of memory. To program a fuse, a relatively high current is selectively routed to the fuse to cause the fuse to burn out. Intersections where fuses remain are one logic value and intersections where fuses are burned out are the other logic value.

In inkjet printheads, fuse technology has been included in N-channel metal-oxide semiconductor (NMOS) chips. In these NMOS chips, fuses are programmed in substantially the same way, where fuses are selectively burned out to program a bit. However, programming chips in this way has some drawbacks. If a chip is improperly programmed, there is no way to fix it and the chip must be discarded. Also, fuses are relatively large and can be unreliable. In addition, fuses can damage the orifice layer of the inkjet during programming and after a fuse burns out metal debris from the fuse can be drawn into the ink and cause blockage in the inkjet pen, resulting in poor quality printing.

In recent years, electronically programmable read-only memory (EPROM) devices have been developed. These EPROM devices include a conductive grid of rows and columns, but they do not include fuses. Instead, a memory cell is located at each row/column intersection. Each memory cell includes a transistor structure and two gates that are separated from each other by a thin dielectric layer. One of the gates is a floating gate and the other is a control gate or input gate. In an unprogrammed memory cell, the floating gate has no charge, which causes the threshold voltage to be low. In a programmed memory cell, the floating gate is charged with electrons and the threshold voltage is higher. To program a memory cell, a programming voltage (e.g., 10 to 16 volts) is applied to the control gate and drain. This programming voltage draws excited electrons to the floating gate, thereby increasing the threshold voltage. A memory cell having a lower threshold voltage is one logic value and a memory cell having a higher threshold voltage is the other logic value.

DETAILED DESCRIPTION

In the following detailed description, reference is made to the accompanying drawings which form a part hereof, and in which is shown by way of illustration specific examples in which the invention may be practiced. In this regard, directional terminology, such as "top," "bottom," "front," "back," "leading," "trailing," etc., is used with reference to the orientation of the Figure(s) being described. Because components of examples of the present invention can be positioned in a number of different orientations, the directional terminology is used for purposes of illustration and is in no way limiting. It is to be understood that other examples may be utilized and structural or logical changes may be made without departing from the scope of the present invention. The following detailed description, therefore, is not to be taken in a limiting sense, and the scope of the present invention is defined by the appended claims. It is to be understood that features of the various examples described herein may be combined with each other, unless specifically noted otherwise.

Figure 1:
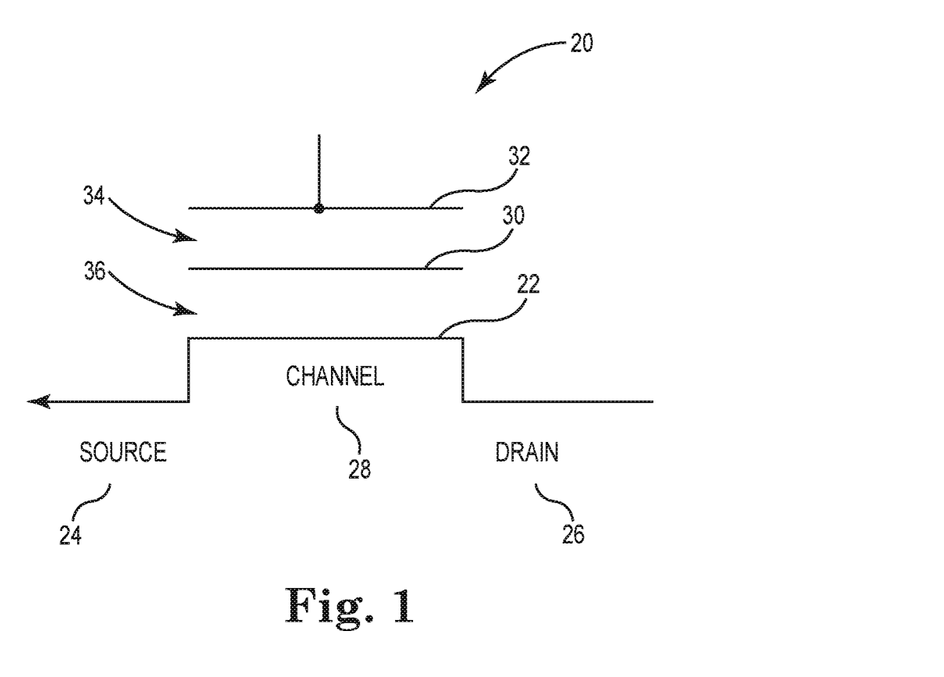
FIG. 1 is a diagram illustrating one example of an EPROM cell that stores one bit of information.

FIG. 1 is a diagram illustrating one example of an EPROM cell 20 that stores one bit of information. EPROM cell 20 does not include a fuse and provides a number of advantages over an NMOS fused bit. EPROM cells, such as EPROM cell 20, can be used to eliminate fuses in systems, such as ink jet printhead systems.

EPROM cell 20 includes a semiconductor substrate 22 having a source 24, a drain 26, and a channel 28, where channel 28 is situated between source 24 and drain 26. A floating gate 30 is situated over channel 28 and an input gate 32, also referred to as control gate 32, is situated over floating gate 30. Source 24 includes an N+ doped region and drain 26 includes an N+ doped region. Channel 28 is a p doped region situated between the N+ doped regions of source 24 and drain 26.

Control gate 32 is capacitively coupled to floating gate 30 via a dielectric material 34 that is situated between control gate 32 and floating gate 30. A voltage at control gate 32 is coupled to floating gate 30. Another layer of dielectric material 36 is disposed between floating gate 30 and substrate 22 over channel 28.

To program EPROM cell 20, a high voltage bias is applied to drain 26. This high voltage bias on drain 26 generates energetic "hot" carriers or electrons. A positive voltage bias between control gate 32 and drain 26 pulls some of these hot electrons onto floating gate 30. As electrons are pulled onto floating gate 30, the threshold voltage of EPROM cell 20, i.e., the voltage required to cause channel 28 to conduct current, increases. If enough electrons are pulled onto floating gate 30, the threshold voltage increases to a level above a specified threshold voltage and EPROM cell 20 blocks current at the specified threshold voltage level, which changes the logic state of EPROM cell 20 from one logic value to the other logic value. Thus, EPROM cell 20 is programmed via hot carrier injection onto floating gate 30. In normal operation, a sensor (not shown) is used to detect the state of EPROM cell 20.

Figure 2:
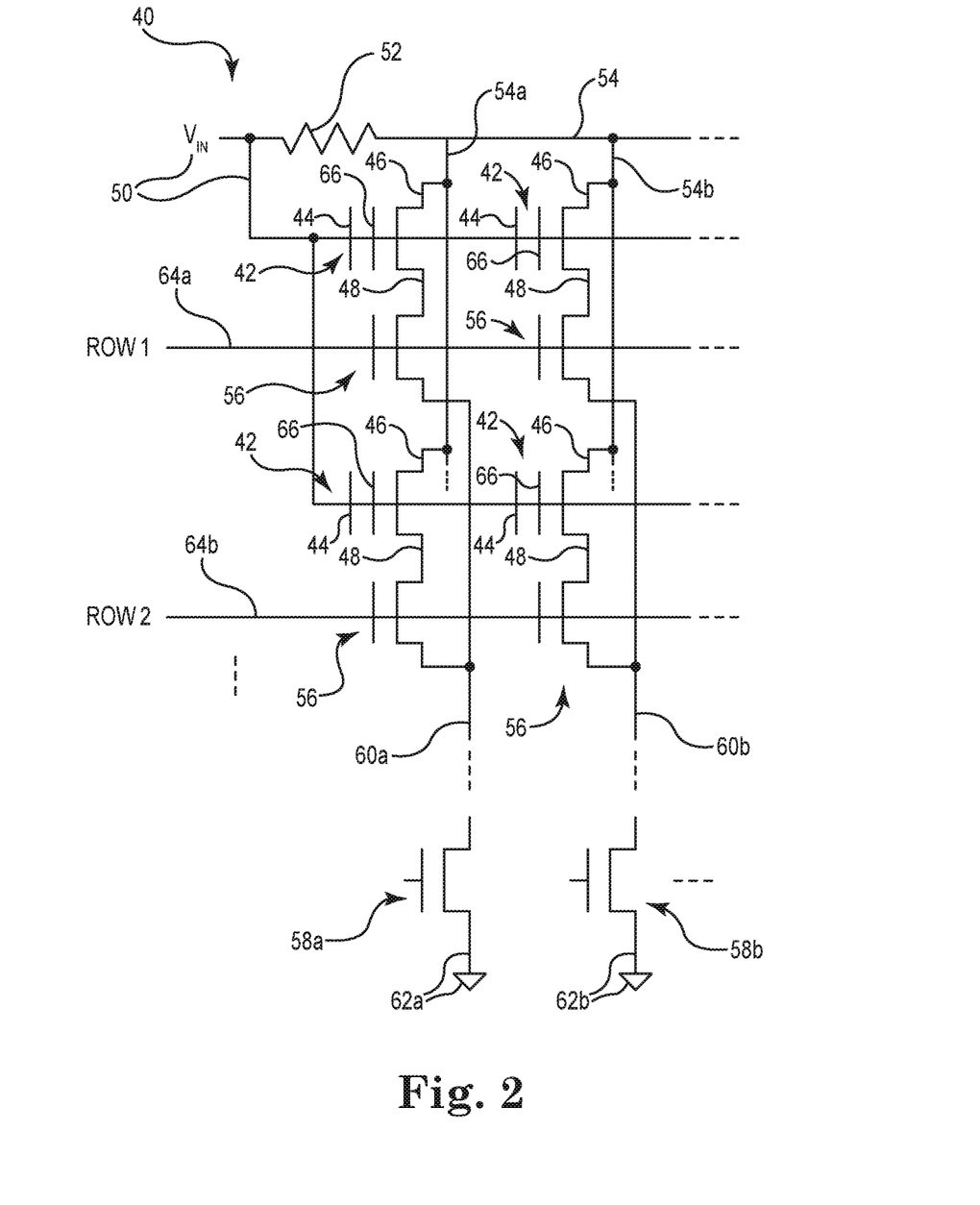
FIG. 2 is a diagram illustrating one example of an EPROM array.

FIG. 2 is a diagram illustrating one example of an EPROM array 40 including EPROM cells 42 arranged in rows and columns. In one example, each of the EPROM cells 42 is similar to EPROM cell 20 of FIG. 1.

Each of the EPROM cells 42 includes a control gate 44, a drain 46, and a source 48. Control gates 44 are electrically coupled to input voltage Vin at 50. Drains 46 are electrically coupled together and to series resistor 52 via drain line 54, including drain lines 54a and 54b. The other side of series resistor 52 is electrically coupled to input voltage Vin at 50. Sources 48 are electrically coupled to the drains of row transistors 56, where the sources of row transistors 56 are electrically coupled to the drains of column transistors 58a and 58b via column lines 60a and 60b. The sources of column transistors 58a and 58b are electrically coupled to references at 62a and 62b, such as ground. Row transistors 56 and column transistors 58a and 58b provide selection of EPROM cells 42 for programming and reading.

Row lines 64a and 64b are electrically coupled to the gates of row transistors 56. Row line 64a provides row signal ROW1 at 64a to the gates of row transistors 56 in one row and row line 64b provides row signal ROW2 at 64b to the gates of row transistors 56 in another row. The sources of row transistors 56 in a given column are electrically coupled together and to the drain of one of the column transistors 58a and 58b that corresponds to the given column. The gates of each column transistor 58a and 58b are electrically coupled to a voltage source via column select lines (not shown).

Each of the EPROM cells 42 is programmed by applying a voltage pulse to the control gate 44 and drain 46 of the EPROM cell 42, across drain 46 to source 48 of the EPROM cell 42. This provides hot carriers or electrons to floating gate 66. The time required for programming is a function of at least the floating gate voltage, the quantity of hot electrons drawn to the floating gate, the threshold voltage needed, and the thickness of gate oxide between the substrate and the floating gate. For each of the EPROM cells 42, control gate 44 is coupled to drain 46 via resistor 52 to limit the breakdown current. In one example, resistor 52 has a resistance of 100 ohms.

In one example, the programming voltage across drain 46 to source 48 is close to the breakdown voltage of the EPROM cell 42, where the breakdown voltage is the voltage at which the EPROM cell 42 begins to conduct with its control gate 44 below the threshold voltage, such as zero volts. In one example, an EPROM cell 42 has been programmed at a voltage of about 16V, where the circuit has a breakdown voltage of 15V. In one example, the floating gate voltage is in the range of 5V to 12V. In one example, the threshold voltage is in the range of 3V to 7V.

To read one of the EPROM cells 42, the threshold voltage is detected using a sensor (not shown). Detecting the threshold voltage can be done by setting the gate/drain voltage and measuring the corresponding current or by setting the current and measuring the voltage. The on resistance (Ron) of the EPROM cell 42 changes by a factor of about 2 from being unprogrammed to being programmed.

To program one of the EPROM cells 42, the EPROM cell 42 is selected by providing a row select voltage to one of the row lines 64a and 64b and a column select voltage to the gate of one of the column transistors 58a and 58b. Next, a relatively high input voltage Vin, such as 16V, is provided at 50. Only the selected EPROM cell 42 has substantially the full input voltage Vin across drain 46 to source 48. All other EPROM cells 42 have source 48 floating to the voltages on the other terminals. To sense the state of a selected EPROM cell 42, a relatively low input voltage pulse Vin, such as 5V, is provided at 50 and the current through the selected EPROM cell 42 is monitored. In other examples, each EPROM cell 42 has a different control transistor coupled to it, where each EPROM cell 42 is selected via one control line coupled to the corresponding control transistor.

Figure 3:
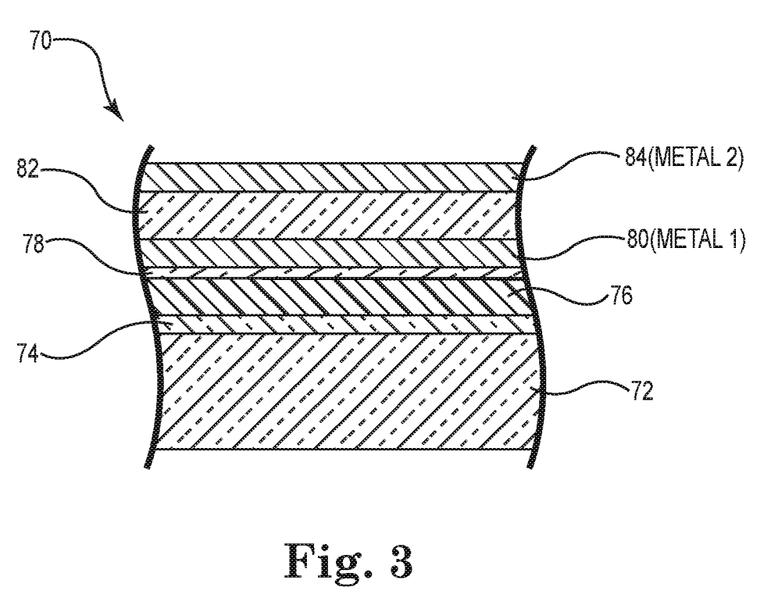
FIG. 3 is a diagram illustrating one example of the layers in an EPROM chip.

FIG. 3 is a diagram illustrating one example of the layers in an EPROM chip 70. In one example, EPROM chip 70 includes EPROM cells, such as EPROM cell 20 of FIG. 1. In one example, EPROM chip 70 includes EPROM array 40 of FIG. 2 and EPROM cells 42 (shown in FIG. 2). In one example, EPROM chip 70 is used in an inkjet printhead. In one example, EPROM chip 70 is an inkjet control EPROM chip.

EPROM chip 70 includes a semiconductor substrate 72, an oxide layer 74, a polysilicon layer 76, a first dielectric layer 78, a metal 1 layer 80, a second dielectric layer 82, and a metal 2 layer 84. Oxide layer 74 is disposed on substrate 72 between substrate 72 and polysilicon layer 76. First dielectric layer 78 is disposed on polysilicon layer 76, and second dielectric layer 82 is dispose on metal 1 layer 80 that separates metal 1 layer 80 from metal 2 layer 84. Metal 1 layer 80 and metal 2 layer 84 provide row lines, column lines, and other connections in EPROM chip 70. In one example, oxide layer 74 is silicon dioxide (SiO2). In one example, second dielectric layer 82 includes silicon nitride. In one example, second dielectric layer 82 includes silicon carbide. In one example, second dielectric layer 82 includes silicon nitride and silicon carbide.

Figure 4:
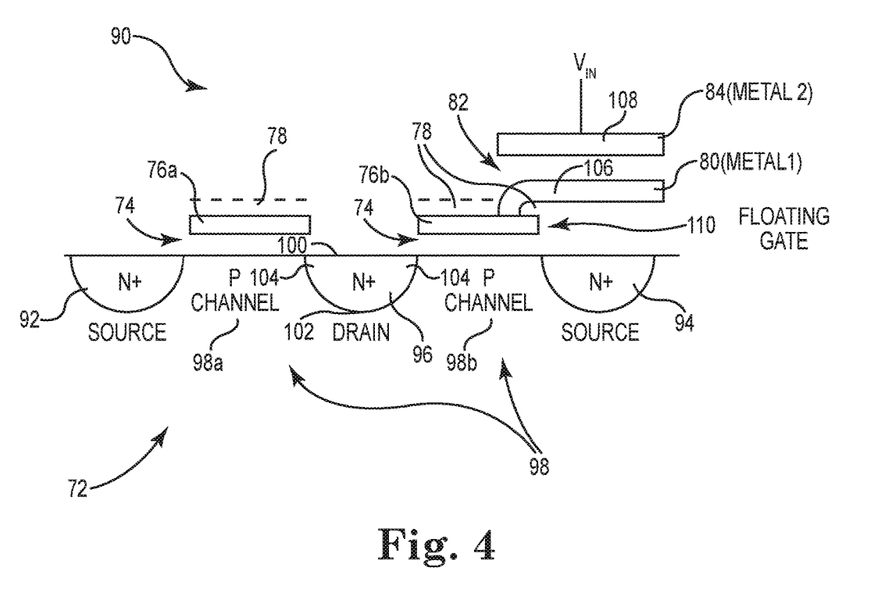
FIG. 4 is a diagram illustrating one example of an EPROM cell that uses the layers of the EPROM chip of FIG. 3.

FIG. 4 is a diagram illustrating one example of an EPROM cell 90 that uses the layers of EPROM chip 70 of FIG. 3. In one example, EPROM cell 20 of FIG. 1 is similar to EPROM cell 90. In one example, each of the EPROM cells 42 (shown in FIG. 2) is similar to EPROM cell 90. In one example, EPROM cell 90 is used in an inkjet printhead system. In other examples, EPROM cell 90 is created using the layers of a different process.

EPROM cell 90 includes substrate 72 that has N+ source regions 92 and 94, an N+ drain region 96, and a p channel 98 including p channel regions 98a and 98b. Drain region 96 includes a top surface 100, a bottom 102, and sides 104 between top surface 100 and bottom 102. Channel 98, including channel regions 98a and 98b, surrounds drain region 96 around the sides 104 of drain region 96. Channel 98 is situated between source region 92 and drain region 96 and between source region 94 and drain region 96. In one example, source regions 92 and 94 are connected and part of one continuous source region that surrounds channel 98.

Channel 98 includes a rounded closed curve structure around drain region 96, where a curve is defined as an object similar to a line, but not required to be straight, which entails that a line is a special case of a curve, namely a curve with null curvature. Also, a closed curve is defined as a curve that joins up and has no endpoints, and a rounded closed curve is a closed curve that has at least one rounded or arched corner or no corners, such that it does not have sharp or angled corners. In one example, channel 98, including channel regions 98a and 98b, is an elliptically shaped channel around drain region 96. In one example, channel 98, including channel regions 98a and 98b, is a circular shaped channel around drain region 96. In one example, channel 98, including channel regions 98a and 98b, has multiple straight sides and at least one rounded corner to form a rounded closed curve channel around drain region 96. In one example, channel 98, including channel regions 98a and 98b, has at least one rounded exterior corner to form a rounded closed curve channel around drain region 96. In one example, channel 98, including channel regions 98a and 98b, has at least one rounded exterior corner and at least one rectangular interior corner to form a rounded closed curve channel around drain region 96.

All of the above examples include a rounded closed curve structure to increase the uniformity of the length of the channel throughout the width of the channel, relative to a rectangular channel. Increasing the uniformity of the length of the channel, increases the uniformity of the generation of hot carriers and improves programming efficiency of the EPROM cell. One example channel includes a substantially uniform channel length throughout the width of the channel.

EPROM cell 90 includes capacitive coupling between metal 1 layer 80 and metal 2 layer 84, where metal 1 layer 80 and metal 2 layer 84 form parallel opposing capacitor plates 106 and 108. One capacitor plate 106 is formed in metal 1 layer 80 and the other capacitor plate 108 is formed in metal 2 layer 84. The capacitor plate 108 formed in metal 2 layer 84 is the control gate 108 of EPROM cell 90. The input voltage Vin is applied to control gate 108 and capacitively coupled to the capacitor plate 106. In one example, control gate 108 is similar to control gate 32 (shown in FIG. 1). In one example, control gate 108 is similar to one of the control gates 44 (shown in FIG. 2).

A parallel floating gate 110 is formed in polysilicon layer 76, where floating gate 110 includes polysilicon floating gate regions 76a and 76b situated over channel regions 98a and 98b, respectively. Floating gate 100, including floating gate regions 76a and 76b, forms a rounded closed curve floating gate, such that floating gate 110 and channel 98 include rounded closed curve structures. In one example, floating gate 110, including floating gate regions 76a and 76b, is the same shape as channel 98, including channel regions 98a and 98b.

A break or hole in dielectric layer 78 allows capacitor plate 106 in metal 1 layer 80 to be electrically coupled to floating gate 110, including floating gate regions 76a and 76b. Floating gate 110 is separated from substrate 72 by dielectric layer 74. In one example, dielectric layer 74 is a silicon dioxide layer between channel 98 and floating gate 110.

Floating gate 110, including floating gate regions 76a and 76b, includes a rounded closed curve structure, where a curve is defined as an object similar to a line, but not required to be straight, which entails that a line is a special case of a curve, namely a curve with null curvature. Also, a closed curve is defined as a curve that joins up and has no endpoints, and a rounded closed curve is a closed curve that has at least one rounded or arched corner or no corners, such that it does not have sharp or angled corners. In one example, floating gate 110 is an elliptically shaped floating gate. In one example, floating gate 110 is a circular shaped floating gate. In one example, floating gate 110 has multiple straight sides and at least one rounded corner to form a rounded closed curve floating gate. In one example, floating gate 110 has at least one rounded exterior corner to form a rounded closed curve floating gate. In one example, floating gate 110 has at least one rounded exterior corner and at least one rectangular interior corner to form a rounded closed curve floating gate.

All of the above examples include a rounded closed curve structure to increase the uniformity of the length of the floating gate throughout the width of the floating gate, relative to a rectangular floating gate. Increasing the uniformity of the length of the floating gate, increases the uniformity of the generation of hot carriers and improves programming efficiency of the EPROM cell. One example floating gate includes a substantially uniform floating gate length throughout the width of the floating gate.

To program EPROM cell 90, a high input voltage pulse is applied to control gate 108 and drain region 96, across drain region 96 to source regions 92 and 94. This generates energetic "hot" carriers or electrons. A positive voltage bias between control gate 108 and drain region 96 pulls some of these hot electrons onto floating gate 110. As electrons are pulled onto floating gate 110, the threshold voltage of EPROM cell 90, i.e., the voltage required to cause channel 98 to conduct current, increases. If enough electrons are pulled onto floating gate 110, the threshold voltage increases to a level above a specified threshold voltage and EPROM cell 90 blocks current at a specified threshold voltage level, which changes the logic state of EPROM cell 90 from one logic value to the other logic value. Thus, EPROM cell 90 is programmed via hot carrier injection onto floating gate 110.

To read or sense the state of EPROM cell 90, the threshold voltage is detected using a sensor (not shown). Detecting the threshold voltage can be done by setting the gate/drain voltage and measuring the corresponding current or by setting the current and measuring the voltage. The on resistance (Ron) of EPROM cell 90 changes by a factor of about 2 from being unprogrammed to being programmed.

The EPROM structure disclosed herein can replace fuses in many types of circuits without adding process layers and cost. This configuration provides cells that are larger than traditional EPROM cells, but smaller than fuses. EPROM cells configured this way can also be used for other purposes. Since the charge on the floating gate is cumulative, this configuration can be used to store cumulative quantities. For example, in an inkjet printhead, EPROM cells can be successively reprogrammed to track the number of pages printed out, or for other purposes. Also, since programming of EPROM cells modifies the threshold voltage of the cell, successive programming of these cells can be used to control analog circuits, such as to create a variable time delay. Other applications are also possible.

Manufacturers work on improving EPROM programming efficiency and production yields, where reductions in programming efficiency and yield can come from memory cells that are difficult to program, referred to as stubborn bits, and memory cells that have high or inconsistent unprogrammed resistance values, referred to as unprogrammed bit consistency.

The rounded closed curve structures of the channel and the floating gate improve programming efficiency over a rectangular channel and rectangular floating gate EPROM cell. The rounded closed curve structures of the channel and the floating gate provide a preprogramming EPROM ratio that is more centered around a specified value and reduced as compared to the preprogramming EPROM ratio provided via a rectangular channel and rectangular floating gate EPROM cell. In one example, programming efficiency is improved twenty percent over a rectangular channel and rectangular floating gate EPROM cell.

Figure 5:
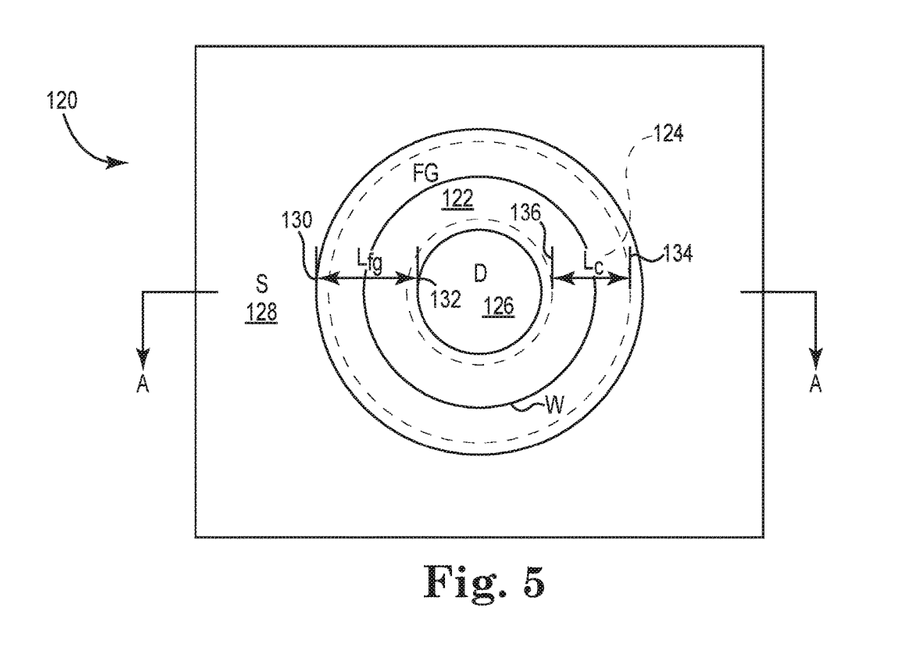
FIG. 5 is a top-view diagram illustrating one example of an EPROM cell that includes a circular floating gate and a circular channel.

FIG. 5 is a top-view diagram illustrating one example of an EPROM cell 120 that includes a circular floating gate 122 and a circular channel 124. Channel 124 is situated under floating gate 122 and indicated by dotted lines. Also, some of the layers of EPROM cell 120, such as metal layers, are not shown for clarity. EPROM cell 120 is similar to EPROM cell 90 of FIG. 4. In one example, a cross-section of EPROM cell 120 taken along the line A-A is similar to the cross-section of EPROM cell 90 of FIG. 4.

EPROM cell 120 includes floating gate 122, channel 124, a drain 126, and a source 128. Circular channel 124 is situated under circular floating gate 122. Channel 124 surrounds drain 126 and is situated between drain 126 and source 128. Source 128 surrounds channel 124. In one example, floating gate 122 is polysilicon, channel 124 is a p channel region, drain 126 is an N+ region, and source 128 is an N+ region.

Circular floating gate 122 is an elliptically shaped floating gate, where its circular shape is a special case of an ellipse. Circular floating gate 122 includes a rounded closed curve structure having rounded corners or no corners, such that it does not have sharp or angled corners. Circular floating gate 122 has a floating gate length Lfg that is the distance from the exterior side 130 of circular floating gate 122 to the interior side 132 of circular floating gate 122. The width W of circular floating gate 122 is the distance around circular floating gate 122 measured at the midpoint of the floating gate length Lfg. In other examples, floating gate 122 can be another elliptical shape, such as an oval, and/or another rounded closed curve shape, such as egg shaped.

Circular channel 124 is an elliptically shaped channel, where its circular shape is a special case of an ellipse. Circular channel 124 includes a rounded closed curve structure having rounded corners or no corners, such that it does not have sharp or angled corners. Circular channel 124 has a channel length Lc that is the distance from the exterior side 134 of circular channel 124 to the interior side 136 of circular channel 124. The width W of circular channel 124 is the distance around circular channel 124 measured at the midpoint of the channel length Lc. In other examples, channel 124 can be another elliptical shape, such as an oval, and/or another rounded closed curve shape, such as egg shaped.

Figure 6:
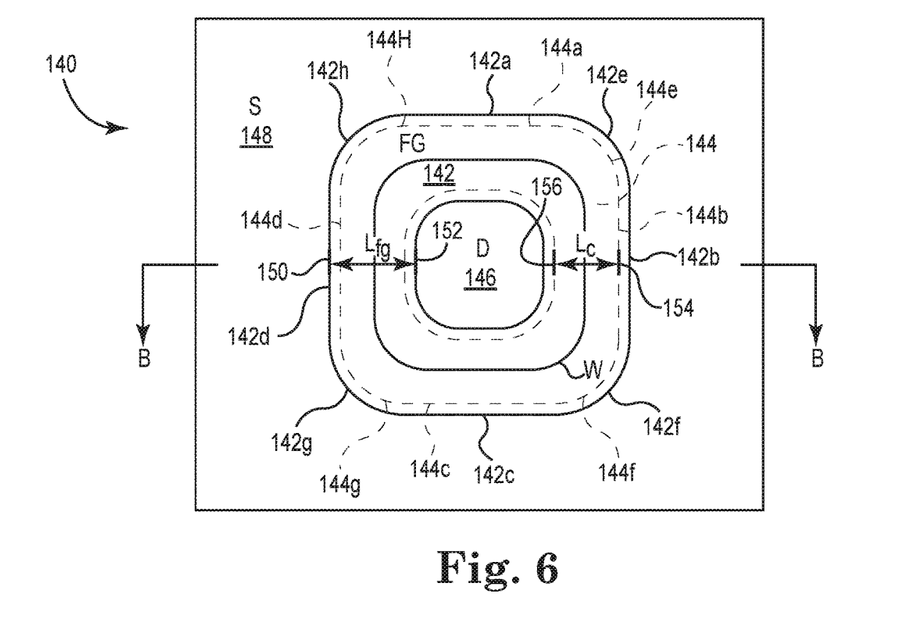
FIG. 6 is a top-view diagram illustrating one example of an EPROM cell that includes a floating gate having multiple straight sides and rounded corners, and a channel having multiple straight sides and rounded corners.

FIG. 6 is a top-view diagram illustrating one example of an EPROM cell 140 that includes a floating gate 142 having multiple straight sides 142a-142d and rounded corners 142e-142h, and a channel 144 having multiple straight sides 144a-144d and rounded corners 144e-144h. Channel 144 is situated under floating gate 142 and indicated by dotted lines. Also, some of the layers of EPROM cell 140, such as metal layers, are not shown for clarity. EPROM cell 140 is similar to EPROM cell 90 of FIG. 4. In one example, a cross-section of EPROM cell 140 taken along the line B-B is similar to the cross-section of EPROM cell 90 of FIG. 4.

EPROM cell 140 includes floating gate 142, channel 144, a drain 146, and a source 148. Channel 144 is situated under floating gate 142. Channel 144 surrounds drain 146 and is situated between drain 146 and source 148. Source 148 surrounds channel 144. In one example, floating gate 142 is polysilicon, channel 144 is a p channel region, drain 146 is an N+ region, and source 148 is an N+ region.

Floating gate 142 has four straight sides 142a-142d and four rounded corners 142e-142h. Floating gate 142 includes a rounded closed curve structure having rounded corners 142e-142h, such that it does not have sharp or angled corners. Floating gate 142 has a floating gate length Lfg that is the distance from the exterior side 150 of floating gate 142 to the interior side 152 of floating gate 142. The width W of floating gate 142 is the distance around floating gate 142 measured at the midpoint of the floating gate length Lfg. In other examples, floating gate 142 can have a different number of straight sides, such as two or three straight sides or more than four straight sides, and a different number of rounded corners, such as two or three rounded corners or more than four rounded corners.

Channel 144 has four straight sides 144a-144d and four rounded corners 144e-144h. Channel 144 includes a rounded closed curve structure having rounded corners 144e-144h, such that it does not have sharp or angled corners. Channel 144 has a channel length Lc that is the distance from the exterior side 154 of channel 144 to the interior side 156 of channel 144. The width W of channel 144 is the distance around channel 144 measured at the midpoint of the channel length Lc. In other examples, channel 144 can have a different number of straight sides, such as two or three straight sides or more than four straight sides, and a different number of rounded corners, such as two or three rounded corners or more than four rounded corners.

Figure 7:
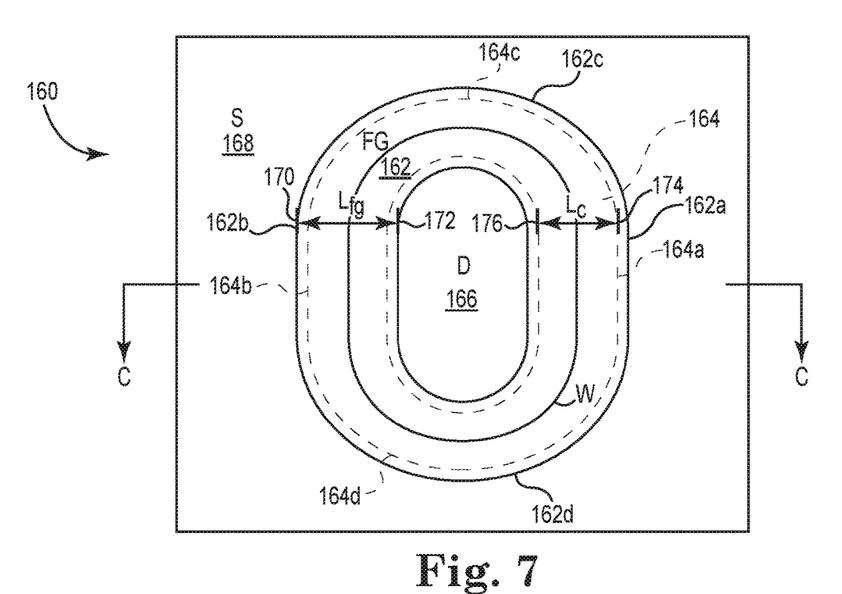
FIG. 7 is a top-view diagram illustrating one example of an EPROM cell that includes a floating gate having multiple straight sides, a rounded top, and a rounded bottom, and a channel having multiple straight sides, a rounded top, and a rounded bottom.

FIG. 7 is a top-view diagram illustrating one example of an EPROM cell 160 that includes a floating gate 162 having multiple straight sides 162a and 162b, a rounded top 162c, and a rounded bottom 162d, and a channel 164 having multiple straight sides 164a and 164b, a rounded top 164c, and a rounded bottom 164d. Channel 164 is situated under floating gate 162 and indicated by dotted lines. Also, some of the layers of EPROM cell 160, such as metal layers, are not shown for clarity. EPROM cell 160 is similar to EPROM cell 90 of FIG. 4. In one example, a cross-section of EPROM cell 160 taken along the line C-C is similar to the cross-section of EPROM cell 90 of FIG. 4.

EPROM cell 160 includes floating gate 162, channel 164, a drain 166, and a source 168. Channel 164 is situated under floating gate 162. Channel 164 surrounds drain 166 and is situated between drain 166 and source 168. Source 168 surrounds channel 164. In one example, floating gate 162 is polysilicon, channel 164 is a p channel region, drain 166 is an N+ region, and source 168 is an N+ region.

Floating gate 162 has two straight sides 162a and 162b, a rounded top 162c, and a rounded bottom 162d. Floating gate 162 includes a rounded closed curve structure having a rounded top 162c and a rounded bottom 162d, such that it does not have sharp or angled corners. Floating gate 162 has a floating gate length Lfg that is the distance from the exterior side 170 of floating gate 162 to the interior side 172 of floating gate 162. The width W of floating gate 162 is the distance around floating gate 162 measured at the midpoint of the floating gate length Lfg.

Channel 164 has two straight sides 164a and 164b, a rounded top 164c, and a rounded bottom 164d. Channel 164 includes a rounded closed curve structure having a rounded top 164c and a rounded bottom 164d, such that it does not have sharp or angled corners. Channel 164 has a channel length Lc that is the distance from the exterior side 174 of channel 164 to the interior side 176 of channel 164. The width W of channel 164 is the distance around channel 164 measured at the midpoint of the channel length Lc.

The rounded closed curve floating gates and channels, shown in FIGS. 5-7, improve programming efficiency over a rectangular channel and rectangular floating gate EPROM cell. The rounded closed curve floating gates and channels increase the uniformity of the channel length and the uniformity of the floating gate length and remove "corner effects' associated with a rectangular channel and rectangular floating gate EPROM cell. Making the channel length and floating gate length more uniform and removing "corner effects" leads to more uniform and efficient generation of hot electrons during programming. Also, the rounded channels and the rounded floating gates provide a preprogramming EPROM ratio that is more centered around a specified value and reduced as compared to the preprogramming EPROM ratio provided via a rectangular channel and rectangular floating gate EPROM cell. In one example, programming efficiency is improved twenty percent over a rectangular channel and rectangular floating gate EPROM cell.

Figure 8:
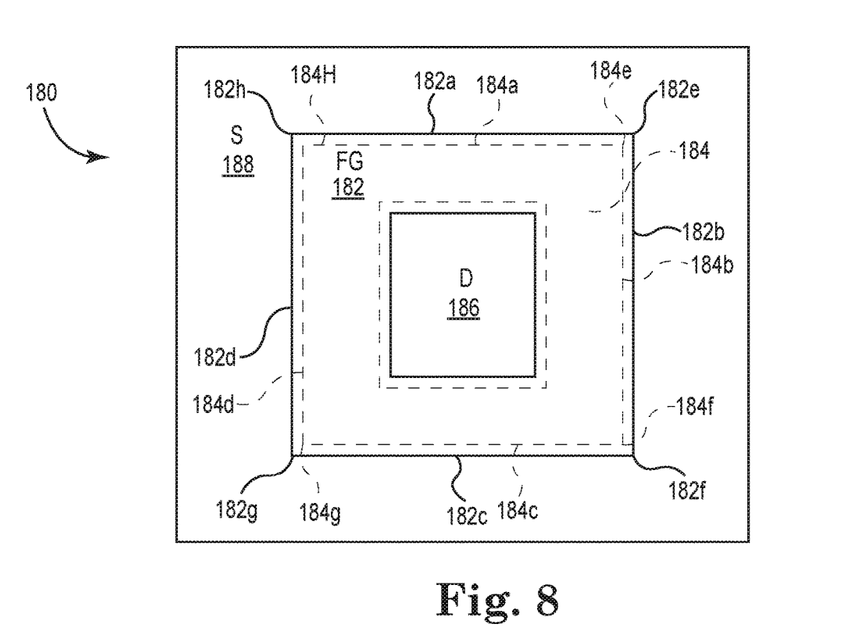
FIG. 8 is a top-view diagram illustrating one example of an EPROM cell that includes a rectangular floating gate and a rectangular channel.

FIG. 8 is a top-view diagram illustrating one example of an EPROM cell 180 that includes a rectangular floating gate 182 having multiple straight sides 182a-182d and sharp angled corners 182e-182h, and a rectangular channel 184 having multiple straight sides 184a-184d and sharp angled corners 184e-184h. Channel 184 is situated under floating gate 182 and indicated by dotted lines. Also, some of the layers of EPROM cell 180, such as metal layers, are not shown for clarity.

EPROM cell 180 includes floating gate 182, channel 184, a drain 186, and a source 188. Channel 184 is situated under floating gate 182. Channel 184 surrounds drain 186 and is situated between drain 186 and source 188. Source 188 surrounds channel 184. In one example, floating gate 182 is polysilicon, channel 184 is a p channel region, drain 186 is an N+ region, and source 188 is an N+ region.

Floating gate 182 has four straight sides 182a-182d and four sharp angled corners 182e-182h. Floating gate 182 does not include a rounded closed curve structure and is not a rounded closed curve floating gate.

Channel 184 has four straight sides 184a-184d and four sharp angled corners 184e-184h. Channel 184 does not include a rounded closed curve structure and is not a rounded closed curve channel.

Figure 9:
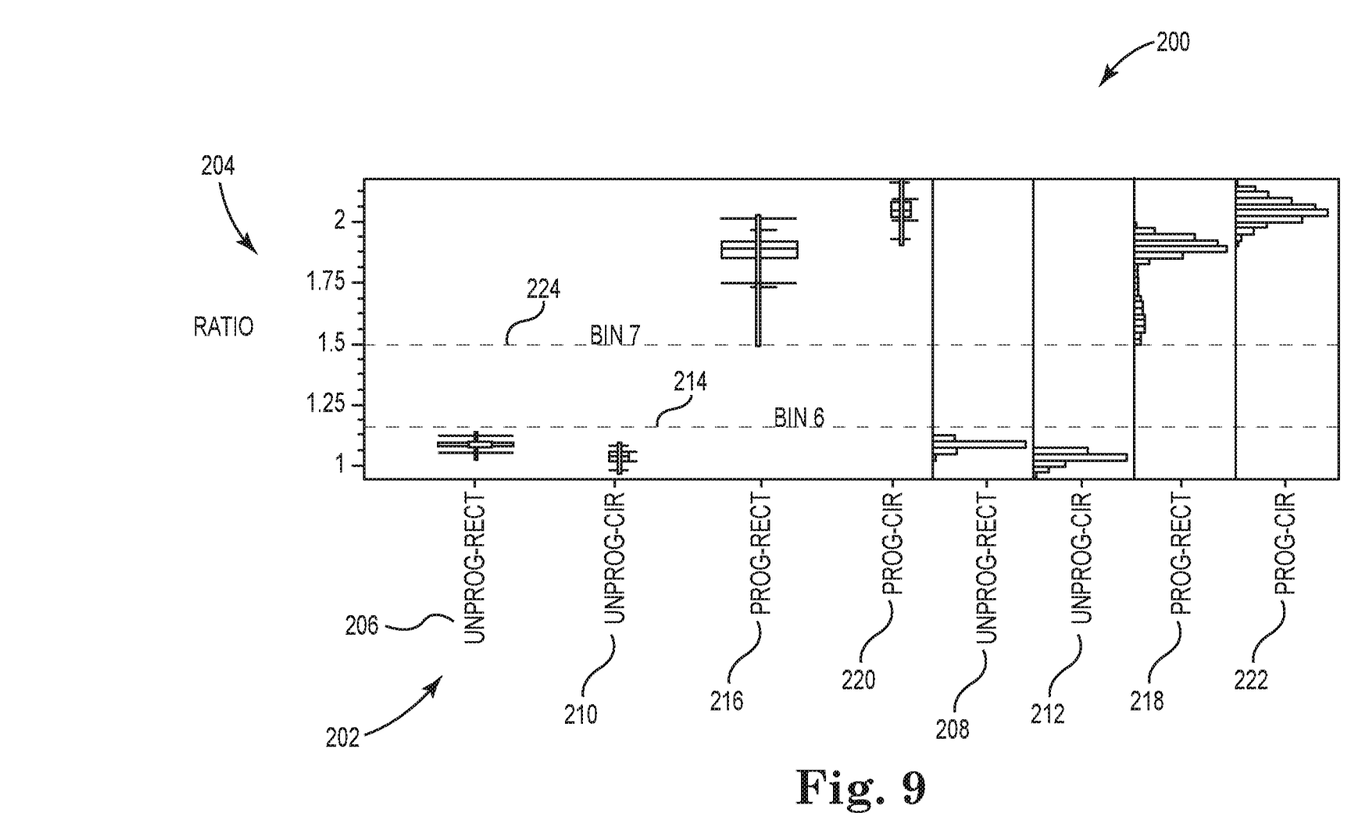
FIG. 9 is a graph illustrating EPROM resistance ratios of EPROM cells having circular floating gates and channels, and EPROM cells having rectangular floating gates and channels.

FIG. 9 is a graph 200 illustrating EPROM resistance ratios of EPROM cells having circular floating gates and channels, such as EPROM cell 120 of FIG. 5, and EPROM cells having rectangular floating gates and channels, such as EPROM cell 180 of FIG. 8. On the x-axis at 202, plots and histograms for EPROM cells having circular floating gates and channels, referred to as circular EPROM cells, are identified with a suffix of Cir, and plots and histograms for EPROM cells having rectangular floating gates and channels, referred to as rectangular EPROM cells, are identified with a suffix of Rect. The y-axis at 204 plots resistance ratios, where each ratio is a measured resistance value to a reference unprogrammed resistance value. Statistics for the graphed resistance ratios are shown in Table 1.

TABLE 1

|  | Mean | Std Dev | Std Err Mean | Lower 95% | Upper 95% |
| --- | --- | --- | --- | --- | --- |
| Unprog-Rect | 1.08644 | 0.013223 | 0.00022 | 1.0860 | 1.0869 |
| Uprog-Cir | 1.03602 | 0.021055 | 0.00067 | 1.0347 | 1.0373 |
| Prog-Rect | 1.84717 | 0.117780 | 0.00193 | 1.8434 | 1.8510 |
| Prog-Cir | 2.04736 | 0.045884 | 0.00145 | 2.0445 | 2.0502 |

Resistance ratios of unprogrammed rectangular EPROM cells (Unprog_Rect) are plotted at 206 in a type of box and whisker plot and at 208 in a histogram, and the resistance ratios of unprogrammed circular EPROM cells (Unprog_Cir) are plotted at 210 in a type of box and whisker plot and at 212 in a histogram. The resistance ratios of unprogrammed circular EPROM cells are generally less than the resistance ratios of unprogrammed rectangular EPROM cells, where the mean unprogrammed resistance ratio decreases from 1.08644 for the rectangular EPROM cells to 1.03602 for the circular EPROM cells. Thus, the mean resistance value of the unprogrammed circular EPROM cells is much closer to and more centered around the reference unprogrammed resistance value, as compared to the mean resistance value of the unprogrammed rectangular EPROM cells. Also, even though the standard deviation of resistance ratios increases from 0.013223 for the rectangular EPROM cells to 0.021055 for the circular EPROM cells, the resistance ratio distribution of the unprogrammed circular EPROM cells is further away from the bin 6 test failure limit at 214, referred to as an unprogrammed bit consistency failure, as compared to the resistance ratio distribution of the unprogrammed rectangular EPROM cells.

The resistance ratios of programmed rectangular EPROM cells (Prog_Rect) are plotted at 216 in a type of box and whisker plot and at 218 in a histogram, and the resistance ratios of programmed circular EPROM cells (Prog_Cir) are plotted at 220 in a type of box and whisker plot and at 222 in a histogram. The resistance ratios of programmed circular EPROM cells are generally higher than the resistance ratios of programmed rectangular EPROM cells, where the mean programmed resistance ratio increases from 1.84717 for the rectangular EPROM cells to 2.04736 for the circular EPROM cells. Thus, the mean resistance value of the programmed circular EPROM cells is more than twice the reference unprogrammed resistance value. Also, the standard deviation of the resistance ratios decreases from 0.117780 for the rectangular EPROM cells to 0.045884 for the circular EPROM cells. The resistance ratio distribution of the programmed circular EPROM cells is further away from the bin 7 test failure limit at 224, referred to as a stubborn bit failure, than the resistance ratio distribution of the programmed rectangular EPROM cells.

The spread between unprogrammed resistance values in circular EPROM cells at 210 and 212 and programmed resistance values in circular EPROM cells at 220 and 222 is greater than the spread between unprogrammed resistance values in rectangular EPROM cells at 206 and 208 and programmed resistance values in rectangular EPROM cells at 216 and 218. The larger spread improves the programming efficiency of circular EPROM cells over the programming efficiency of rectangular EPROM cells. This improved programming efficiency improves programming reliability and provides opportunities for new EPROM applications. In one example, programming efficiency increases 20%.

Also, the robustness of the fabrication process is improved by building EPROM cells having rounded closed curve floating gates and channels, instead of EPROM cells having rectangular floating gates and channels. The rounded closed curve floating gates and channels increase the uniformity of the channel length and the uniformity of the floating gate length and remove "corner effects' associated with a rectangular channel and rectangular floating gate EPROM cell. Making the channel length and the floating gate length more uniform and removing "corner effects" leads to more uniform and efficient generation of hot electrons during programming, as shown by increased programmability. Also, photolithography x-y astigmatism results in gate length variations in rectangular EPROM cells that contribute to reductions in programming efficiency and increased yield losses. The rounded closed curve floating gates and channels provide more uniform gate lengths by eliminating photolithography x-y astigmatism.

Figure 10:
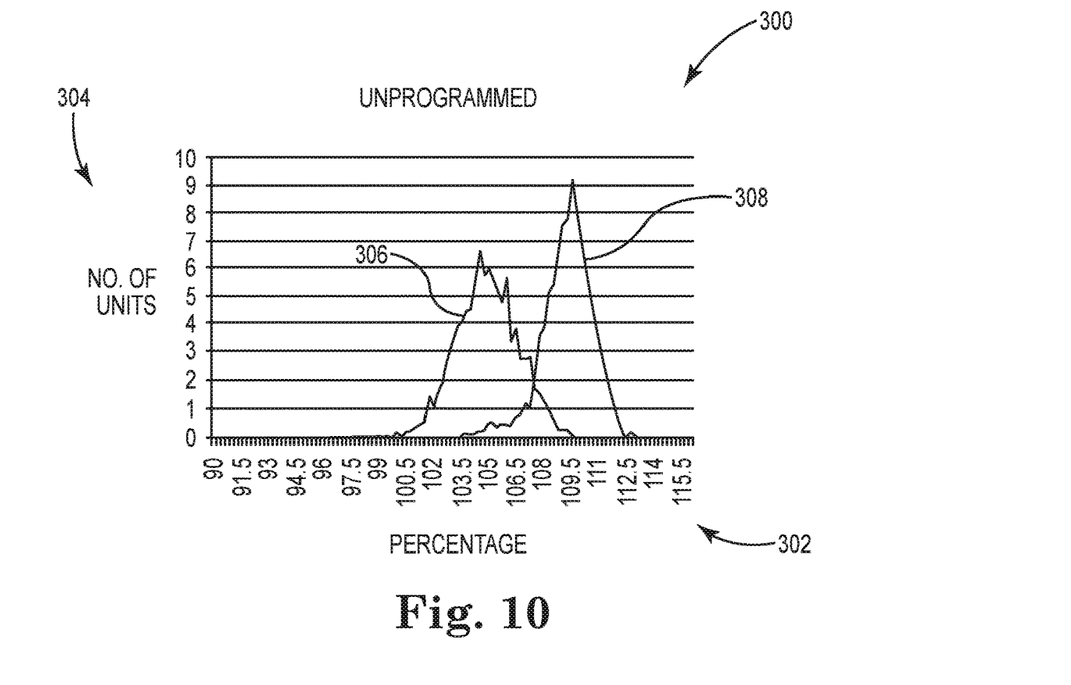
FIG. 10 is a graph illustrating unprogrammed resistance ratios for circular and rectangular EPROM cells.
Figure 11:
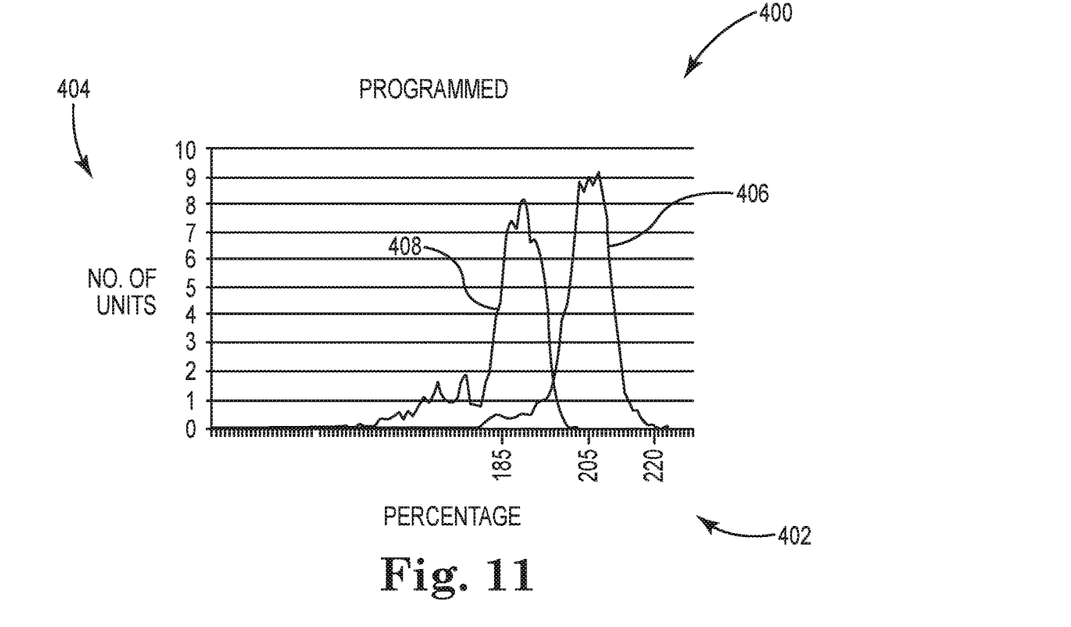
FIG. 11 is a graph illustrating programmed resistance ratios for circular and rectangular EPROM cells.

FIGS. 10 and 11 are graphs illustrating resistance ratios in EPROM cells manufactured using a process having the layers of FIG. 3 and providing the EPROM cell 90 of FIG. 4.

FIG. 10 is a graph 300 illustrating unprogrammed resistance ratios for circular and rectangular EPROM cells. Resistance ratios are graphed as percentages along the x-axis at 302 versus the number of units along the y-axis at 304. Each of the resistance ratios is a measured unprogrammed resistance value divided by a reference unprogrammed resistance value.

Unprogrammed resistance ratios of circular EPROM cells at 306 are centered around a percentage of about 104% and unprogrammed resistance ratios of rectangular EPROM cells at 308 are centered around a percentage of about 109%. This is a reduction in unprogrammed resistance of about 5% for circular EPROM cells over rectangular EPROM cells. The distribution of unprogrammed resistance ratios of circular EPROM cells at 306 is wider than the distribution of the unprogrammed resistance ratios of rectangular EPROM cells at 308, but most of the unprogrammed resistance ratios of circular EPROM cells at 306 are smaller than most of the unprogrammed resistance ratios of rectangular EPROM cells at 308. The centered unprogrammed resistance value of circular EPROM cells at 306 is much closer to and more centered around the reference unprogrammed resistance value, as compared to the centered unprogrammed resistance value of rectangular EPROM cells 308.

FIG. 11 is a graph 400 illustrating programmed resistance ratios for circular and rectangular EPROM cells. Resistance ratios are graphed as percentages along the x-axis at 402 versus the number of units along the y-axis at 404. Each of the resistance ratios is a measured programmed resistance value divided by a reference unprogrammed resistance value.

Programmed resistance ratios of circular EPROM cells at 406 are centered around a percentage of about 205% and programmed resistance ratios of rectangular EPROM cells at 408 are centered around a percentage of about 185%. This is an increase of 20% for circular EPROM cells over rectangular EPROM cells, where the centered resistance value of the programmed circular EPROM cells at 406 is more than twice the reference unprogrammed resistance value. The distribution of programmed resistance ratios of circular EPROM cells at 406 is narrower than the distribution of programmed resistance ratios of rectangular EPROM cells at 408, and most of the programmed resistance ratios of circular EPROM cells at 406 are larger than most of the programmed resistance ratios of rectangular EPROM cells at 408. Thus, the centered programmed resistance value of circular EPROM cells at 406 is further away from the reference unprogrammed resistance value, as compared to the centered programmed resistance value of rectangular EPROM cells 408.

The spread between unprogrammed resistance values in circular EPROM cells at 306 and programmed resistance values in circular EPROM cells at 406 is greater than the spread between unprogrammed resistance values in rectangular EPROM cells at 308 and programmed resistance values in rectangular EPROM cells at 408. The larger spread improves the programming efficiency of circular EPROM cells over the programming efficiency of rectangular EPROM cells. This improved programming efficiency improves programming reliability and provides opportunities for new EPROM applications. In one example, programming efficiency increases 20%.

Figure 12:
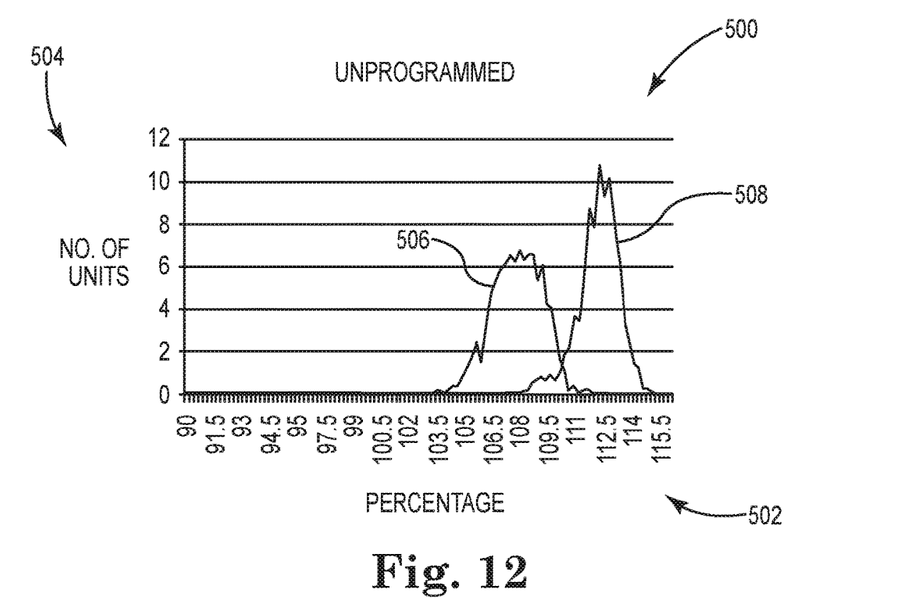
FIG. 12 is a graph illustrating unprogrammed resistance ratios for circular and rectangular EPROM cells fabricated in another suitable process.
Figure 13:
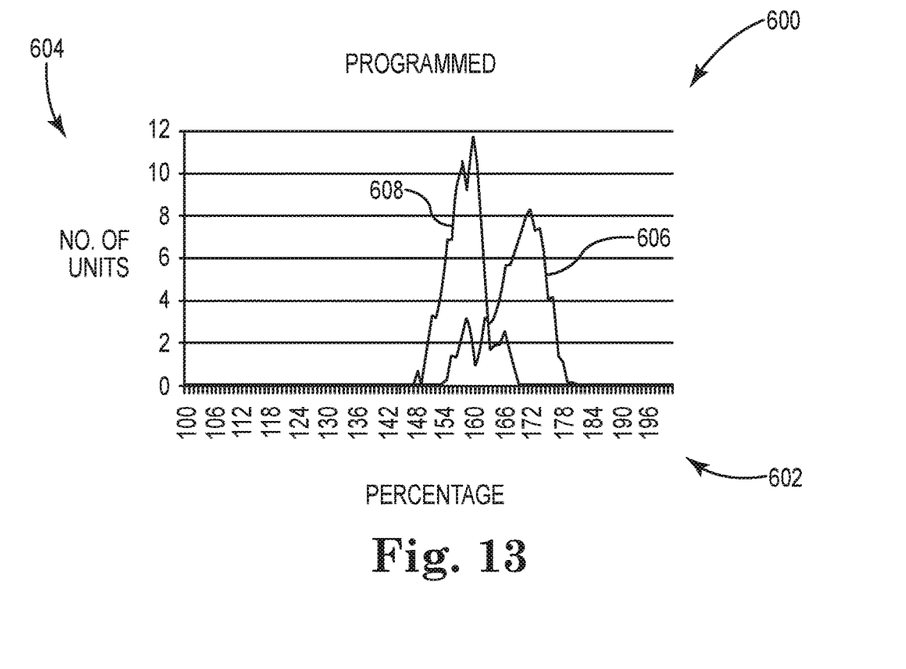
FIG. 13 is a graph illustrating programmed resistance ratios for circular and rectangular EPROM cells fabricated in the other suitable process.

FIGS. 12 and 13 are graphs illustrating resistance ratios in EPROM cells manufactured using another suitable process.

FIG. 12 is a graph 500 illustrating unprogrammed resistance ratios for circular and rectangular EPROM cells. Resistance ratios are graphed as percentages along the x-axis at 502 versus the number of units along the y-axis at 504. Each of the resistance ratios is a measured unprogrammed resistance value divided by a reference unprogrammed resistance value.

Unprogrammed resistance ratios of circular EPROM cells at 506 are centered around a percentage of about 107 or 108% and unprogrammed resistance ratios of rectangular EPROM cells at 508 are centered around a percentage of about 112%. This is a reduction in unprogrammed resistance of about 4 or 5% for circular EPROM cells over rectangular EPROM cells. The distribution of unprogrammed resistance ratios of circular EPROM cells at 506 is wider than the distribution of the unprogrammed resistance ratios of rectangular EPROM cells at 508, but most of the unprogrammed resistance ratios of circular EPROM cells at 506 are smaller than most of the unprogrammed resistance ratios of rectangular EPROM cells at 508. The centered unprogrammed resistance value of circular EPROM cells at 506 is closer to and more centered around the reference unprogrammed resistance value, as compared to the centered unprogrammed resistance value of rectangular EPROM cells 308.

FIG. 13 is a graph 600 illustrating programmed resistance ratios for circular and rectangular EPROM cells. Resistance ratios are graphed as percentages along the x-axis at 602 versus the number of units along the y-axis at 604. Each of the resistance ratios is a measured programmed resistance value divided by a reference unprogrammed resistance value.

Programmed resistance ratios of circular EPROM cells at 606 are centered around a percentage of about 170% and programmed resistance ratios of rectangular EPROM cells at 608 are centered around a percentage of about 158%. This is an increase of 12% for circular EPROM cells over rectangular EPROM cells, where the centered resistance value of the programmed circular EPROM cells at 606 is about 1.7 times the reference unprogrammed resistance value. The distribution of programmed resistance ratios of circular EPROM cells at 606 is similar to the distribution of programmed resistance ratios of rectangular EPROM cells at 608. Thus, the centered programmed resistance value of circular EPROM cells at 606 is further away from the reference unprogrammed resistance value, as compared to the centered programmed resistance value of rectangular EPROM cells 608.

The spread between unprogrammed resistance values in circular EPROM cells at 506 and programmed resistance values in circular EPROM cells at 606 is greater than the spread between unprogrammed resistance values in rectangular EPROM cells at 508 and programmed resistance values in rectangular EPROM cells at 608. The larger spread improves the programming efficiency of circular EPROM cells over the programming efficiency of rectangular EPROM cells. This improved programming efficiency improves programming reliability and provides opportunities for new EPROM applications.

Although specific examples have been illustrated and described herein, it will be appreciated by those of ordinary skill in the art that a variety of alternate and/or equivalent implementations may be substituted for the specific examples shown and described without departing from the scope of the present invention. This application is intended to cover any adaptations or variations of the specific examples discussed herein. Therefore, it is intended that this invention be limited only by the claims and the equivalents thereof.

What is claimed is:

1. A memory cell for a printhead, the memory cell comprising:
    a substrate including a drain and a source, the drain having a first rounded closed curve structure;
    a channel within the substrate and located between the drain and the source, the channel surrounding the drain;
    a floating gate formed in a polysilicon layer and having a second rounded closed curve structure located above the channel;
    a control gate formed in a first metal layer provided over the substrate after the polysilicon layer is provided over the substrate, the control gate capacitively coupled to the floating gate and located above the floating gate; and
    a capacitor plate formed in a second metal layer different from the first metal layer, the capacitor plate electrically connected to the floating gate, the control gate capacitively coupled to the capacitor plate.

2. The memory cell of claim 1, wherein a width of the channel is substantially uniform over a length of the channel.

3. The memory cell of claim 1, wherein the channel is elliptically shaped from a top view of the memory cell, and the floating gate is elliptically shaped from the top view of the memory cell.

4. The memory cell of claim 1, wherein the channel is circular from a top view of the memory cell, and the floating gate is circular from the top view of the memory cell.

5. The memory cell of claim 1, wherein the channel comprises a plurality of straight sides and at least one rounded corner from a top view of the memory cell, and the floating gate comprises a plurality of straight sides and at least one rounded corner from the top view of the memory cell.

6. The memory cell of claim 1, wherein the drain includes an N+ doped region.

7. The memory cell of claim 1, wherein the channel includes a P doped region.

8. The memory cell of claim 1, further comprising a silicon nitride layer between the control gate and the floating gate.

9. The memory cell of claim 1, wherein the first metal layer is disposed above the second metal layer.

10. The memory cell of claim 1, wherein the channel surrounding the drain comprises the channel encircling all sides the drain.

11. The memory cell of claim 1, wherein the channel has a rounded closed curve structure from a top view of the memory cell, the drain has the first rounded closed curve structure from the top view of the memory cell, and the floating gate has the second rounded closed curve structure from the top view of the memory cell.

12. An EPROM array for a printhead, comprising:
    a matrix of EPROM memory cells, wherein each EPROM memory cell includes:
        a substrate including a drain and a source, the drain having a rounded closed curve structure;
        a channel within the substrate and located between the drain and the source, the channel surrounding the drain;
        a floating gate formed in a polysilicon layer and having a second rounded closed curve structure located above the channel;
        a control gate formed in a first metal layer provided over the substrate after the polysilicon layer is provided over the substrate, the control gate capacitively coupled to the floating gate and located above the floating gate; and
        a capacitor plate formed in a second metal layer different from the first metal layer, the capacitor plate electrically connected to the floating gate, the control gate capacitively coupled to the capacitor plate.

13. The EPROM array of claim 12, wherein in each EPROM memory cell, the channel is elliptically shaped from a top view of the EPROM array, and the floating gate is elliptically shaped from the top view of the EPROM array.

14. The EPROM array of claim 12, wherein in each EPROM memory cell, the channel is circular from a top view of the EPROM array, and the floating gate is circular from the top view of the EPROM array.

15. The EPROM array of claim 12, wherein in each EPROM memory cell, the channel includes a plurality of straight sides and at least one rounded corner from a top view of the EPROM array, and the floating gate includes a plurality of straight sides and at least one rounded corner from the top view of the EPROM array.

16. The EPROM array of claim 12, wherein in each EPROM memory cell, a width of the channel is substantially uniform throughout the channel.

17. The EPROM array of claim 12, wherein the control gate overlaps the floating gate above the substrate.

18. The EPROM array of claim 12, wherein the channel has a rounded closed curve structure from a top view of the EPROM array and the channel encircles all sides the drain, the drain has the first rounded closed curve structure from the top view of the EPROM array, and the floating gate has the second rounded closed curve structure from the top view of the EPROM array.

* * * * *